(12) United States Patent
Sugita et al.

(10) Patent No.: US 8,716,130 B2
(45) Date of Patent: May 6, 2014

(54) METHOD OF MANUFACTURING SEMICONDUCTOR DEVICE

(75) Inventors: Kippei Sugita, Nirasaki (JP); Kenji Matsuda, Nirasaki (JP); Hiroyuki Hashimoto, Nirasaki (JP); Muneo Harada, Nirasaki (JP)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 13/643,102

(22) PCT Filed: Apr. 4, 2011

(86) PCT No.: PCT/JP2011/002000
§ 371 (c)(1),
(2), (4) Date: Nov. 14, 2012

(87) PCT Pub. No.: WO2012/001848
PCT Pub. Date: Jan. 5, 2012

(65) Prior Publication Data
US 2013/0089983 A1    Apr. 11, 2013

(30) Foreign Application Priority Data
Jul. 1, 2010    (JP) .................................. 2010-150823

(51) Int. Cl.
*H01L 21/44*    (2006.01)
(52) U.S. Cl.
USPC ......................................................... 438/667
(58) Field of Classification Search
USPC ......................................... 438/667, 666, 597
See application file for complete search history.

(56) References Cited

U.S. PATENT DOCUMENTS

| | | | | |
|---|---|---|---|---|
| 5,030,322 A | * | 7/1991 | Shimada et al. | 216/23 |
| 5,326,430 A | * | 7/1994 | Cronin et al. | 438/584 |
| 5,575,883 A | * | 11/1996 | Nishikawa | 156/345.34 |
| 2006/0178007 A1 | * | 8/2006 | Nakamura et al. | 438/675 |
| 2007/0045780 A1 | * | 3/2007 | Akram et al. | 257/621 |
| 2010/0193949 A1 | * | 8/2010 | Belanger et al. | 257/738 |

FOREIGN PATENT DOCUMENTS

WO    2004064159    7/2004

OTHER PUBLICATIONS

International Search Report—PCT/JP2011/002000 dated Apr. 26, 2011.

* cited by examiner

*Primary Examiner* — Reema Patel
(74) *Attorney, Agent, or Firm* — Cantor Colburn LLP

(57) ABSTRACT

The method includes forming a hole penetrating from one surface of a substrate to an electrode formed on the other surface of the substrate; forming an organic insulating film in the hole; removing at least a part of the organic insulating film formed in a bottom portion of the hole and not the organic insulating film formed on a side wall portion of the hole, to expose the electrode; cleaning an exposed surface of the electrode by using plasma of an inert gas; filling a conductive metal in the hole; removing at least a part of a surface of the organic insulating film by the reaction of oxygen plasma; and annealing the substrate in a dysoxidative atmosphere.

8 Claims, 21 Drawing Sheets

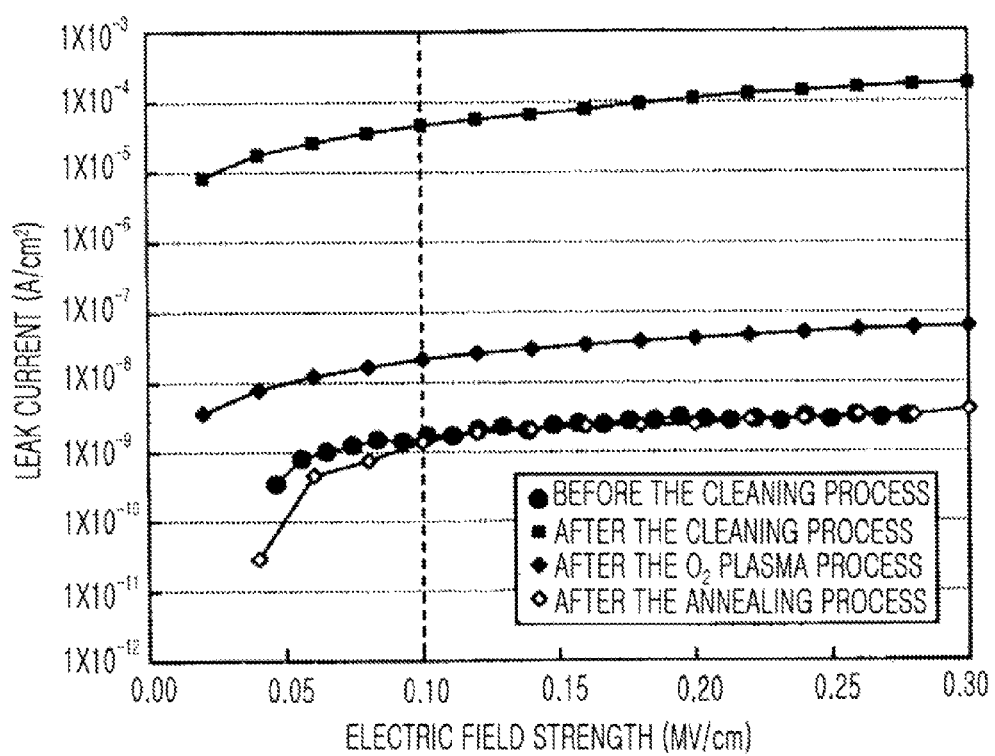

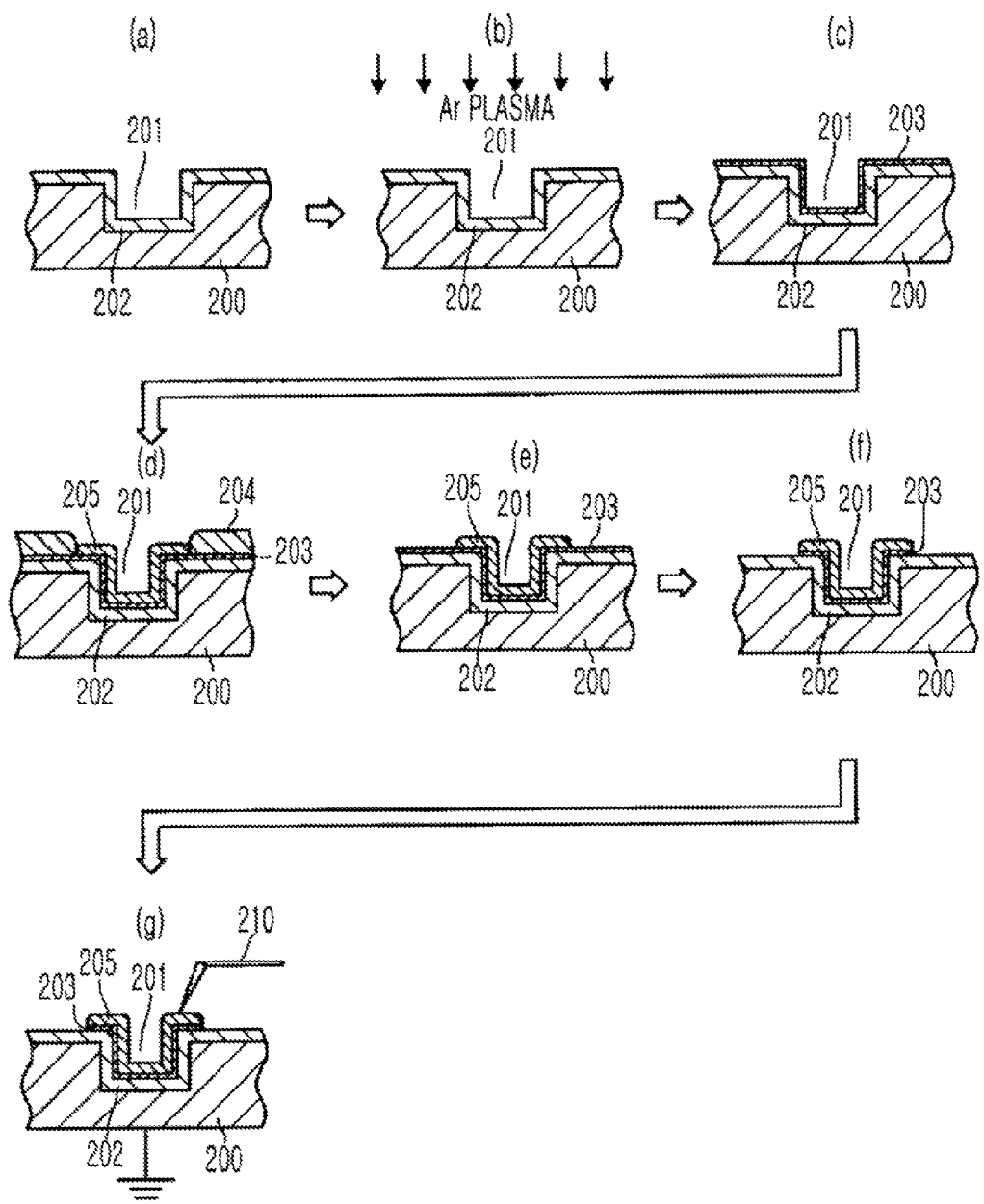

FIG. 14

| | PROCESS | LEAK CURRENT (A/cm²) | CHARACTERISTIC |
|---|---|---|---|
| ① | FORMING THE POLYIMIDE FILM | $1.76 \times 10^{-9}$ | FORM A NORMAL POLYIMIDE FILM, AND DOESN'T HAVE A PROBLEM |
| ② | Ar PLASMA CLEANING PROCESS | $4.72 \times 10^{-5}$ | AN IMIDE BOND IS DISSOLVED ON THE SURFACE OF THE POLYIMIDE FILM, AND THEN THE LEAK CURRENT IS LARGE |
| ③ | O₂ PLASMA PROCESS | $2.17 \times 10^{-6}$ | WHEN THE SURFACE OF THE POLYIMIDE FILM IS REMOVED BY 0.1μm, A SURFACE WHICH HAS AN IMIDE BOND IS SHOWN, BUT THE LEAK CURRENT DOES NOT RETURN TO ITS ORIGINAL STATE |
| ④ | ANNEALING PROCESS | $1.45 \times 10^{-9}$ | THE LEAK CURRENT RETURNS TO A LEVEL WHICH IS THE SAME AS ITS ORIGINAL STATE, AND THEN IT CAN BEAR IN PRACTICE |

METHOD OF MANUFACTURING SEMICONDUCTOR DEVICE

TECHNICAL FIELD

The present invention relates to method of manufacturing a semiconductor device.

BACKGROUND ART

In the manufacturing field of semiconductor devices, there have been many attempts to increase the integration of semiconductor devices by making the semiconductor smaller. Also, recently, attempts are being made to increase the integration per unit area by stacking a semiconductor device, which is referred to as three-dimensional (3D) mounting.

A plurality of semiconductor devices (chips) stacked in a vertical direction include an electrode that is formed through a substrate and thus the semiconductor devices (chips) are electrically connected to one another via the electrode. When the electrode penetrating the substrate is formed, an insulating film is formed in a hole formed in the substrate, and only the insulating film formed in a bottom portion of the hole and not the insulating film formed on a side wall portion of the hole, is removed so as to expose a wiring unit (electrode pad) formed in a surface opposite to the insulating film formed in the bottom portion.

Next, Ar plasma is irradiated to clean, for example, to remove an oxide film formed on a surface of the wiring unit (electrode pad) exposed by a bottom portion of the hole, and then a conductive metal is embedded in the hole, thereby forming an electrode penetrating two sides of the substrate.

As described above, in order to remove only the bottom portion and not the side wall portion of the insulating film formed in the hole, the hole is formed with a tapered shape, a tape is attached to a surface of the substrate, a small hole having a diameter smaller than that of an opening of the hole is punched in the tape to correspond to the hole, and the bottom portion of the insulating film formed in the hole is etched via the small hole formed in the tape (refer to Patent Reference 1).

In the above-described method of manufacturing a semiconductor device, to perform a cleaning process to remove the oxide film formed on the wiring unit exposed by the bottom surface of the hole after removing the insulating film formed in the hole, a process for irradiating plasma of an inert gas, such as Ar plasma, may be performed. However, when an organic film such as a polyimide film is used as the insulating film formed in the hole, if such a cleaning process is performed, the organic film may be damaged due to the Ar plasma, and thus an insulating property may be degraded.

PRIOR ART REFERENCE

Patent Reference (Patent Reference 1) International Publication No. WO2004/064159 Pamphlet

DISCLOSURE OF THE INVENTION

Technical Problem

The present invention provides a method of manufacturing a semiconductor device with good quality and capable of preventing generation of a leak current by recovering degradation of an insulating property of an insulating film resulting from a cleaning process through irradiation of plasma of, e.g., an inert gas, even if an organic film, e.g., a polyimide film, is used as the insulating film.

Technical Solution

According to an aspect of the present invention, a method of manufacturing a semiconductor device includes: forming a hole penetrating from one surface of a substrate to an electrode formed on the other surface of the substrate; forming an organic insulating film in the hole; removing at least a part of the organic insulating film formed in a bottom portion of the hole and not the organic insulating film formed on a side wall portion of the hole, to expose the electrode; cleaning an exposed surface of the electrode by using plasma of an inert gas; filling a conductive metal in the hole; removing at least a part of a surface of the organic insulating film by the reaction of oxygen plasma; and annealing the substrate in a dysoxidative atmosphere.

Advantageous Effects

According to embodiments of the present invention, even if an organic film such as a polyimide film is used as an insulating film, degradation of an insulating property of the insulating film caused by cleaning through irradiation of plasma of an inert gas may be restored, and thus a good quality semiconductor device capable of preventing generation of a leak current may be manufactured.

BRIEF DESCRIPTION OF THE DRAWINGS

FIG. 2 is a graph showing a measurement result of a leak current in a real sample according to an embodiment of the present invention;

FIG. 3 is views for describing a manufacturing process of a real sample according to an embodiment of the present invention;

FIG. 14 is a table showing leak currents and characteristics of a polyimide film after performing various processes according to an embodiment of the present invention.

BEST MODE FOR CARRYING OUT THE INVENTION

Hereinafter, the present invention will be described in detail by explaining exemplary embodiments of the invention with reference to the attached drawings.

Figure 4:
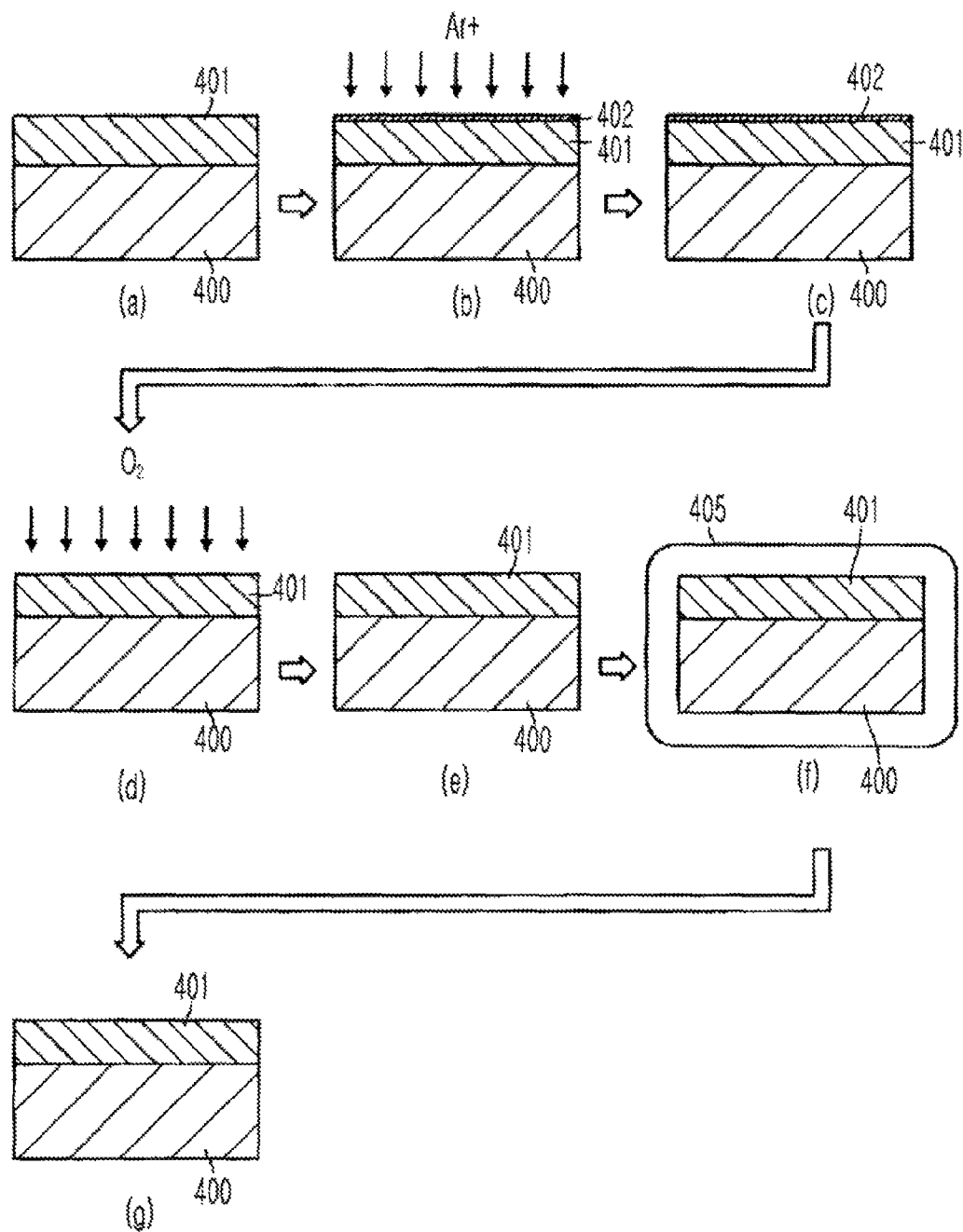
FIG. 4 is views for describing a process according to an embodiment of the present invention.

FIG. 4 is schematic views for describing a process according to an embodiment of the present invention, FIG. 4 shows a process of manufacturing a sample for measuring an insulating property of a polyimide film to be described below. As shown in part (a) of FIG. 4, a polyimide film 401 is formed on a silicon substrate 400 by evaporation polymerization.

Next, as shown in part (b) of FIG. 4, similarly to a cleaning process performed on a real semiconductor device, Ar plasma is irradiated on a surface of the polyimide film 401, Part (c) of FIG. 4 shows a state of the polyimide film 401 after performing the cleaning process. The Ar plasma is irradiated on the surface of the polyimide film 401, and thus a layer 402 in which a change occurred, for example, an imide ring disappears, is formed on the surface of the polyimide film 401.

Next, as shown in part (d) of FIG. 4, the layer 402 in which the imide ring disappears is removed by using oxygen plasma. Part (e) of FIG. 4 shows a state where a film thickness of the polyimide film 401 is reduced by removing the layer 402.

Then, as shown in part (f) of FIG. 4, the silicon substrate 400 is disposed in a heating atmosphere 405 and is heated, and thus a series of processes are finished as shown in part (g) of FIG. 4.

Hereinafter, a measurement result of a leak current for ascertaining an insulation performance of the polyimide film at the times of various processes by using a method shown in FIG. 5 and an analysis result of a composition according to an XPS will be described.

Figure 5:
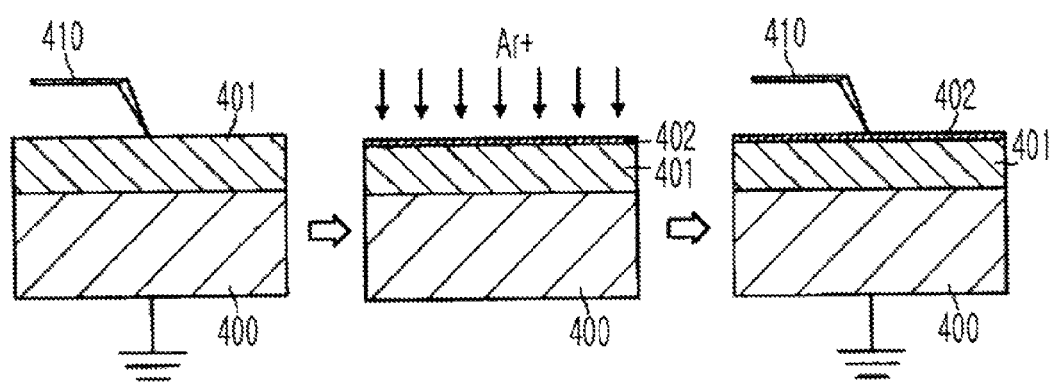
FIG. 5 is a view for describing a method of measuring a leak current of a polyimide film before and after performing a cleaning process according to an embodiment of the present invention.

FIG. 5 is a view for describing a method of measuring a leak current of the polyimide film 401 before and after performing a cleaning process. In the method, the silicon substrate 400 is grounded, a terminal 410 for measuring a current, which is in capable of applying a voltage, is disposed on a surface of the polyimide film 401 (or the layer 402 in which an imide ring disappears), the voltage to be applied is gradually increased from 0, and current values detected at the voltages are recorded.

Figure 6:
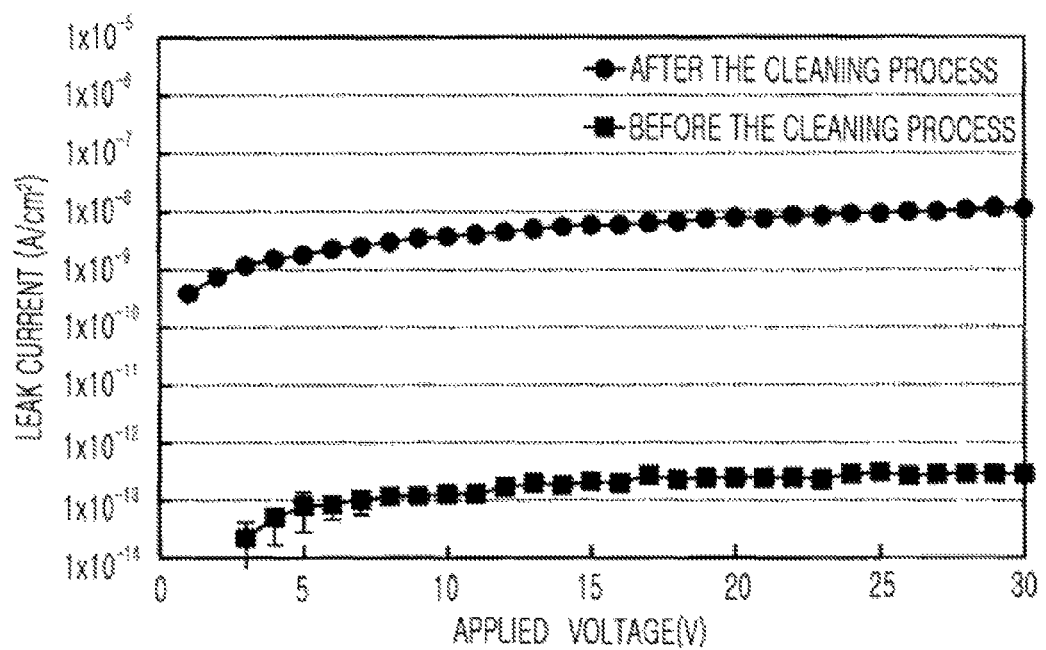
FIG. 6 is a graph showing a measurement result of a leak current of a polyimide film before and after performing a cleaning process according to an embodiment of the present invention.

FIG. 6 is a graph showing changes in a leak current according to the application of the voltage before and after performing the cleaning process of part (b) of FIG. 4, that is, in the states shown in parts (a) and (c) of FIG. 4. As shown in FIG. 6, since the polyimide film 401 with leak current equal to or less than $1.0 \times 10^{-12}$ A/cm$^2$ generates a leak current equal to or greater than $1.0 \times 10^{-10}$ A/cm$^2$ after the cleaning process through Ar plasma irradiation, the performance of the polyimide film 401 as an insulating film is degraded.

For example, when the applied voltage represented by a horizontal axis is 10 V, the leak currents before and after the cleaning process were $1.2 \times 10^{-13}$ A/cm$^2$ and $3.6 \times 10^{-9}$ A/cm$^2$, respectively.

Figure 7:
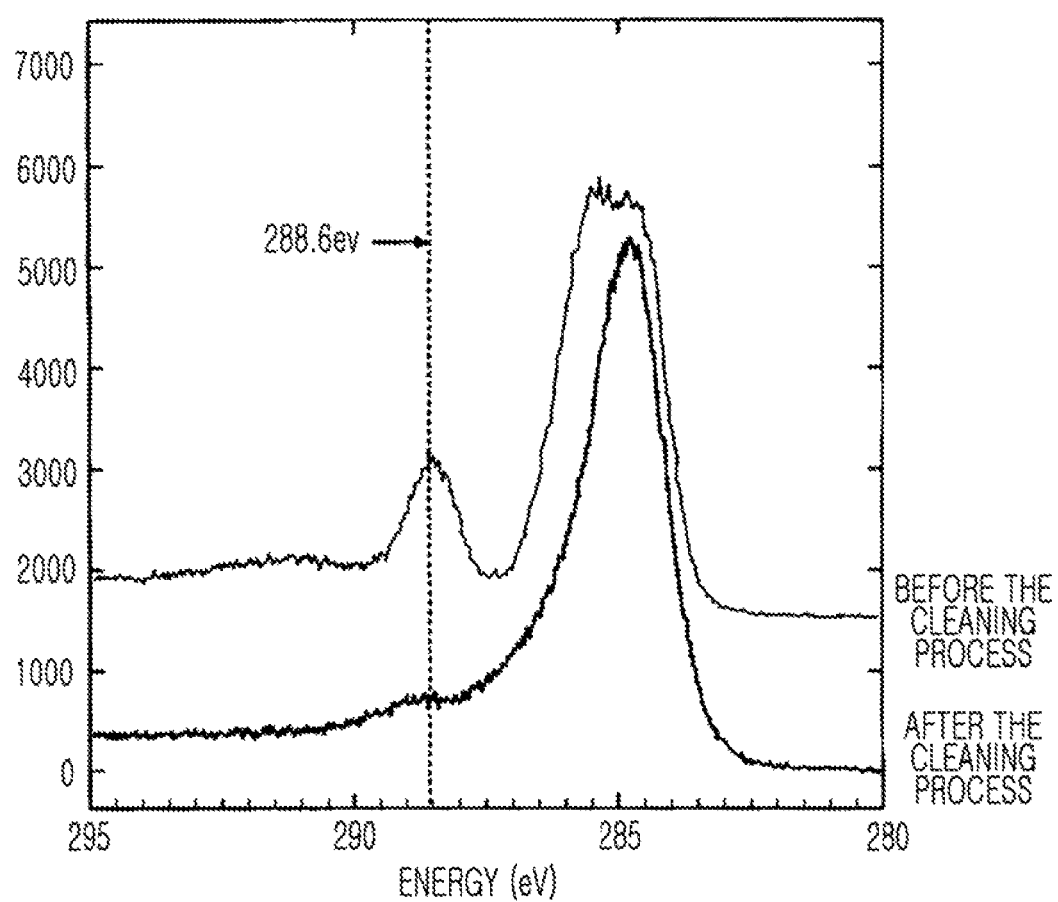
FIG. 7 is a graph showing an X-ray photoelectron spectroscopy (XPS) analysis result of a surface of a polyimide film before and after performing a cleaning process according to an embodiment of the present invention.
Figure 8:
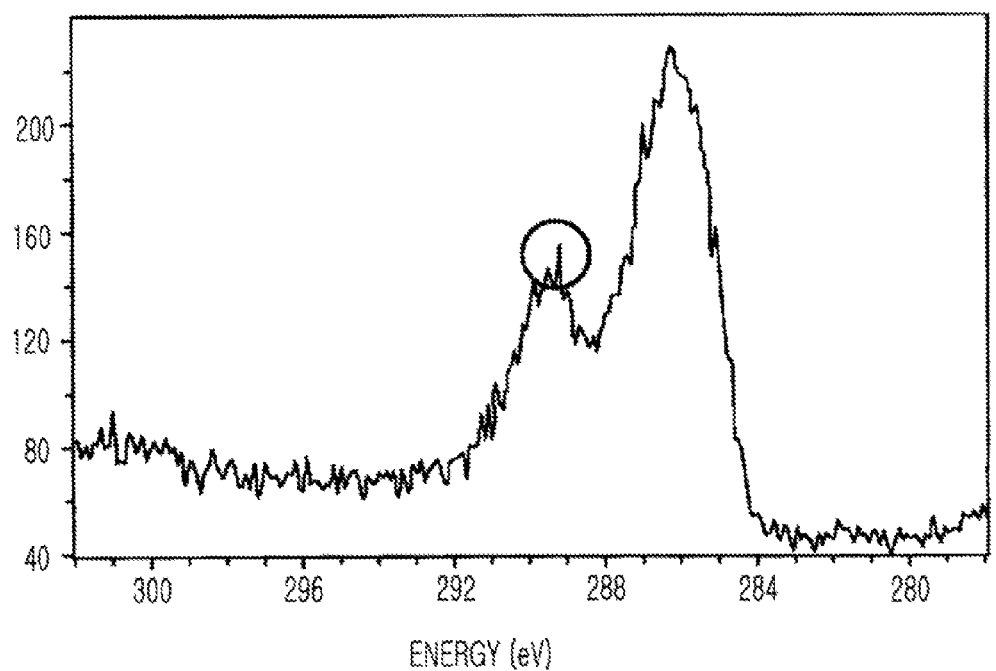
FIG. 8 is a graph showing an XPS analysis result of a surface of a polyimide film when a depth of the surface of the polyimide film removed by using oxygen plasma is 0.1 μm according to an embodiment of the present invention.
Figure 9:
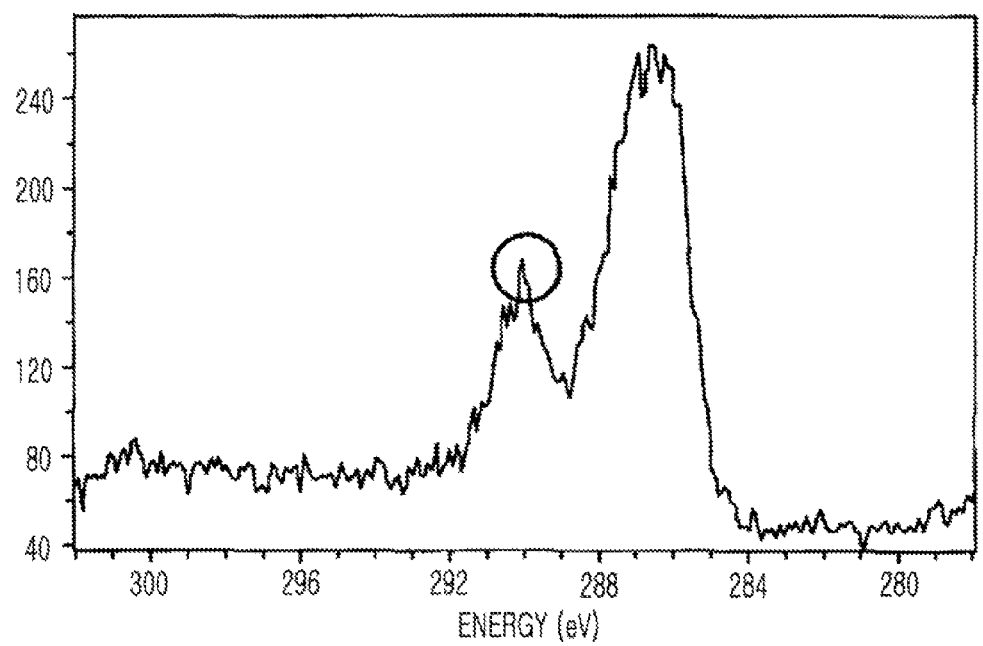
FIG. 9 is a graph showing an XPS analysis result of a surface of a polyimide film when a depth of the surface of the polyimide film removed by using oxygen plasma is 0.3 μm according to an embodiment of the present invention.

After a surface of the polyimide film of a sample having a measurement result shown in the graph of FIG. 6 is analyzed according to XPS, a peak derived from an 2$ imide ring, which has a bond energy of about 288.6 eV, is decreased due to the cleaning process, as shown in FIG. 7. The horizontal axis of the graph shown in FIG. 7 represents energy of photoelectrons based on irradiated X-rays, and a vertical axis represents the number of observed photoelectrons, and this is also applied to the graphs shown in FIGS. 8 to 10.

Next, the damaged polyimide film (or the layer 402 in which an imide ring disappear) is removed by O$_2$ plasma, which corresponds to part (d) of FIG. 4, and its characteristic is measured. Although a thickness of the formed polyimide film is 1 μm, a surface of the polyimide film after removing the surface of the polyimide film by 0.1 μm (AG, 8), 0.3 μm (FIGS. 9), and 0.6 μm (FIG. 10) is analyzed according to XPS. As shown again in a circle in FIG. 8, if the surface of the damaged polyimide film 401 is removed by 0.1 μm, the peak derived from an imide ring, which has a bond energy of about 288.6 eV, is represented again.

Figure 11:
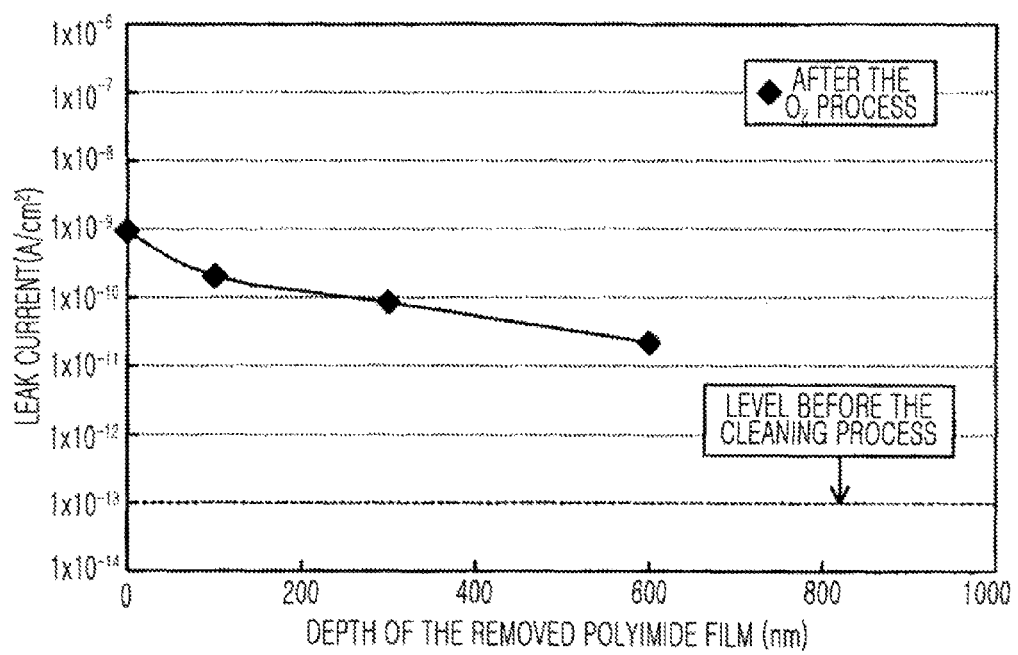
FIG. 11 is a graph showing a measurement result of a relationship between a depth of a surface removed by using oxygen plasma and a leak current of a polyimide film according to an embodiment of the present invention.

However, as shown in FIG. 11, if a leak current of each sample is measured, the leak current is always equal to or greater than $1.0 \times 10^{-11}$ A/cm$^2$, and the performance of the polyimide film as an insulating film is not restored to its original state while maintaining a low performance.

Figure 12:
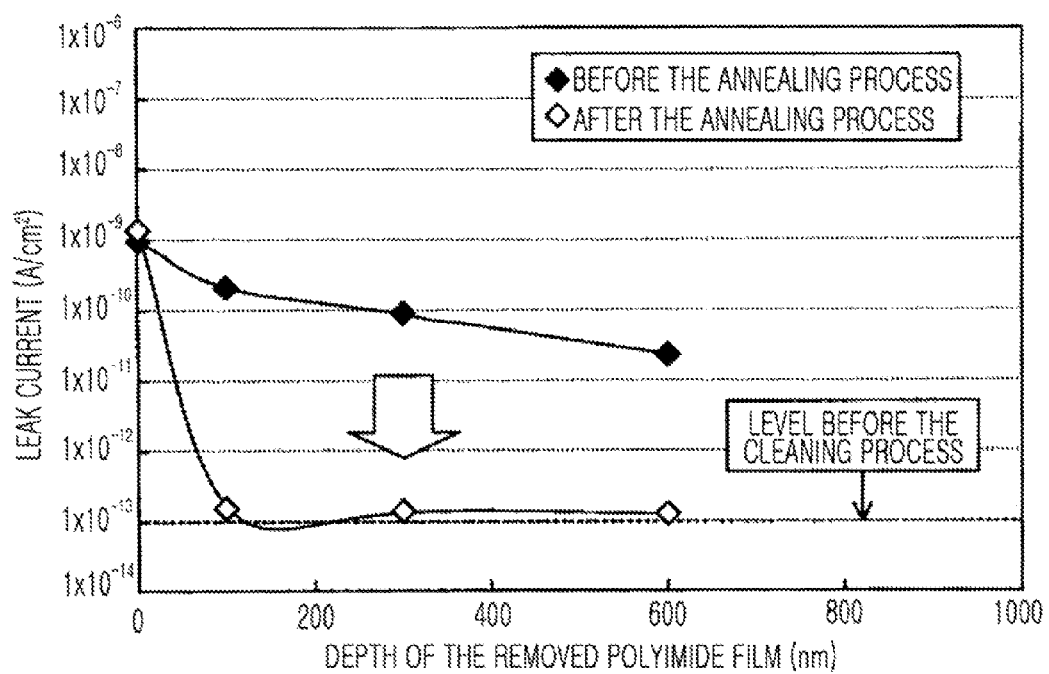
FIG. 12 is a graph showing a measurement result of a relationship between a depth of a surface removed by using oxygen plasma and a leak current of a polyimide film after performing annealing according to an embodiment of the present invention.

Also, annealing is performed at a temperature of 400° C. on the sample in which the damaged polyimide film is removed using O$_2$ plasma. As a result, if the surface of the polyimide film is removed by 0.1 μm or greater, the leak current returns to a level (exponent) of $1.0 \times 10^{-13}$ A/cm$^2$ which is the same as before the cleaning process, as shown in FIG. 12.

Figure 13:
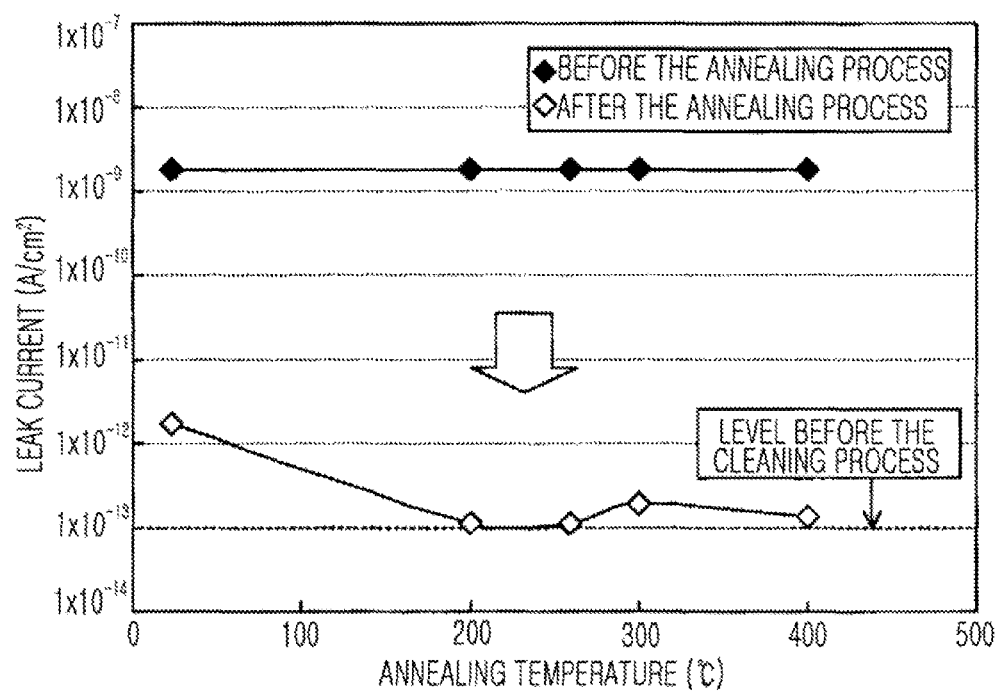
FIG. 13 is a graph showing a measurement result of a leak current of a polyimide film after performing annealing while changing an annealing temperature according to an embodiment of the present invention.

Also, the annealing is performed by changing the temperature. As a result, as shown in FIG. 13, if the temperature of the annealing is equal to or greater than 200° C., an insulating performance of the polyimide film may be restored to that before the cleaning process when the surface of the polyimide film is removed by 0.1 μm.

3D mounting is performed on a semiconductor wafer in which the semiconductor device is previously formed. The semiconductor device may be formed of any of various materials, and may be formed of a material that may not withstand a high temperature. Accordingly, the semiconductor device may be processed at a low temperature instead of a high temperature. Here, the low temperature refers to a temperature equal to or less than 300° C. To perform a process at a temperature equal to or less than 300° C. is very important in order to prevent damage to the semiconductor device formed in the semiconductor wafer.

Hereinafter, details of the present invention will be described with another embodiment of the present invention.

FIGS. 1A to 1H are enlarged cross-sectional views of a major portion of the semiconductor wafer W as a processing target to describe a process according to an embodiment of the present invention.

Figure 1A:
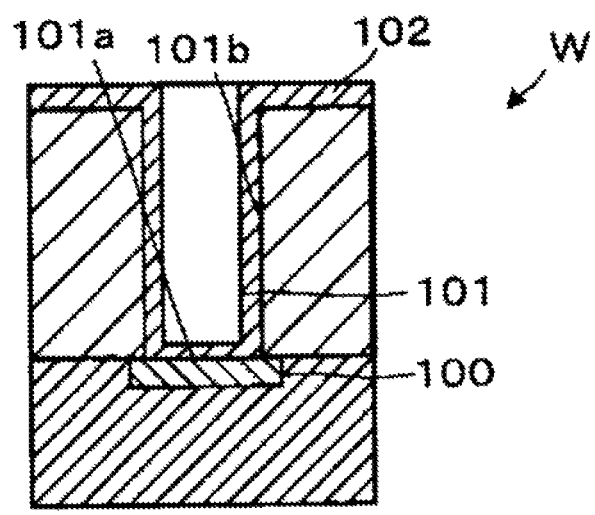
FIGS. 1A to 1H are views for describing a process according to an embodiment of the present invention.

A semiconductor circuit is formed in the semiconductor wafer W shown in FIGS. 1A to 1H, which is formed of silicon, and then a thinning process is performed on the semiconductor wafer W by grinding the semiconductor wafer W from a rear surface thereof. The semiconductor wafer W is temporarily attached to a tray, the rear surface of the semiconductor wafer W is disposed to face upwards, and a predetermined lithography process is performed thereon, thereby forming a hole 101 penetrating the semiconductor wafer W and connected to a wiring unit (electrode pad) 100, as shown in FIG. 1A. Then, an organic insulating film is formed on a surface of the semiconductor wafer W including a bottom portion 101a and a side wall portion 101b of the hole 101, that is, a polyimide film 102 in the current embodiment is formed.

The polyimide film 102 may be formed by, for example, evaporation polymerization. When the polyimide film 102 is formed by evaporation polymerization, a co-evaporation polymerization reaction may be provoked on the semiconductor wafer W by using, e.g., PMDA and ODA as a monomer raw material to uniformly form the polyimide film 102 on the semiconductor wafer W. A film thickness of the polyimide film 102 may be, for example, about 1.0 μm.

Figure 1B:
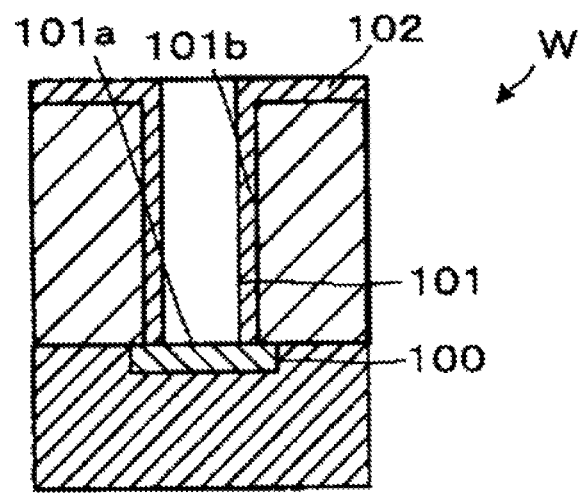
Figure 1C:
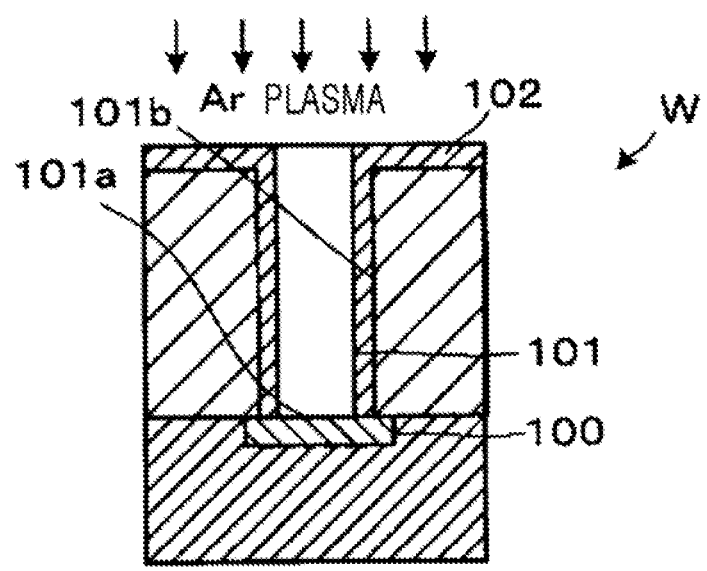

Next, as shown in FIG. 1B, the polyimide film 102 formed on the side wall portion 101b of the hole 101 remains, and only the polyimide film 102 formed in the bottom portion 101a of the hole 101 is removed, and thus the wiring portion 100 is exposed by the hole 101. This process may be performed by using a well-known method using, for example, a mask for protecting the polyimide film 102 formed on the side wall portion 101b of the hole 101.

Figure 10:
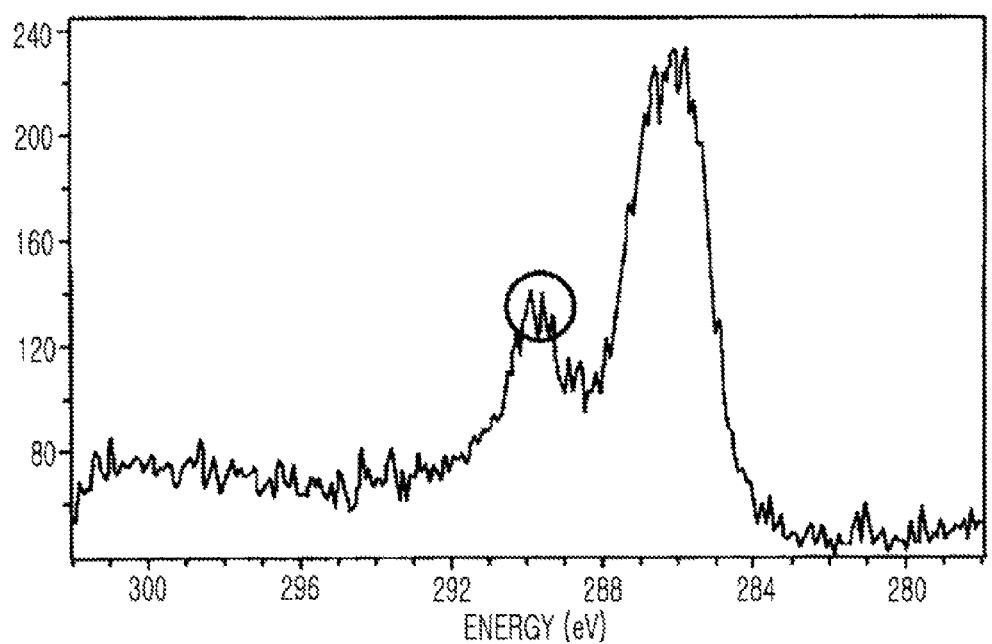
FIG. 10 is a graph showing an XPS analysis result of a surface of a polyimide film when a depth of the surface of the polyimide film removed by using oxygen plasma is 0.6 μm according to an embodiment of the present invention.

Next, as shown in FIG. 10, plasma of an inert gas, Ar plasma in the current embodiment, is irradiated to the semiconductor wafer W, and a cleaning process for removing, for example, an oxide film formed on a surface of the exposed wiring unit 100 is performed. The polyimide film 102 may be damaged due to the irradiation of Ar plasma, and thus, an insulating property of the polyimide film 102 may be degraded.

Figure 1D:
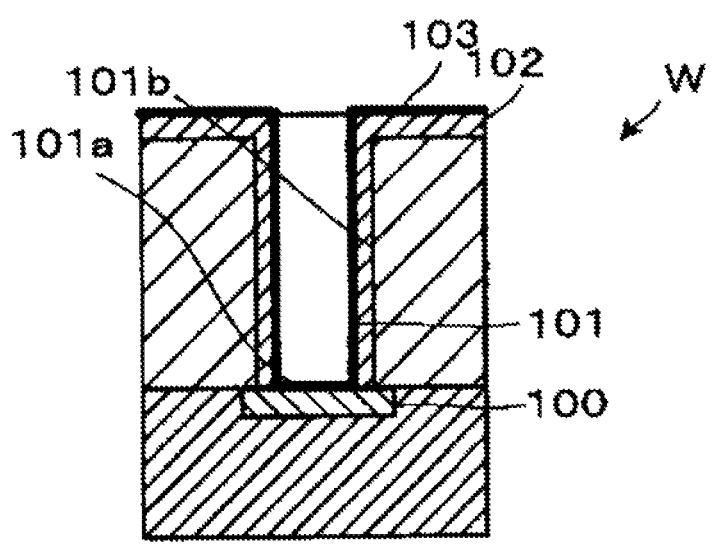

Next, as shown in FIG. 1D, a barrier seed layer 103, for example, a sputtering film of Cu/TiN/Ti, is formed in the hole 101.

Figure 1E:
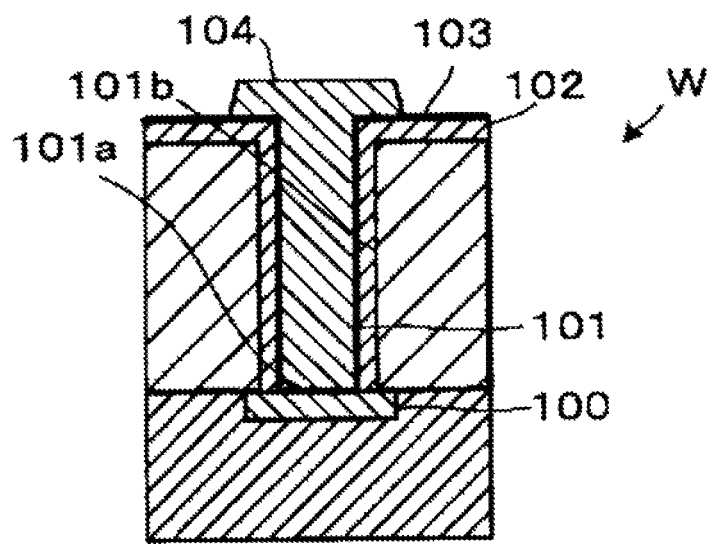

Next, as shown in FIG. 1E, a conductive metal 104 is filled in the hole 101 to form an electrode penetrating the semiconductor wafer W to be electrically connected to the wiring portion 100.

Figure 1F:
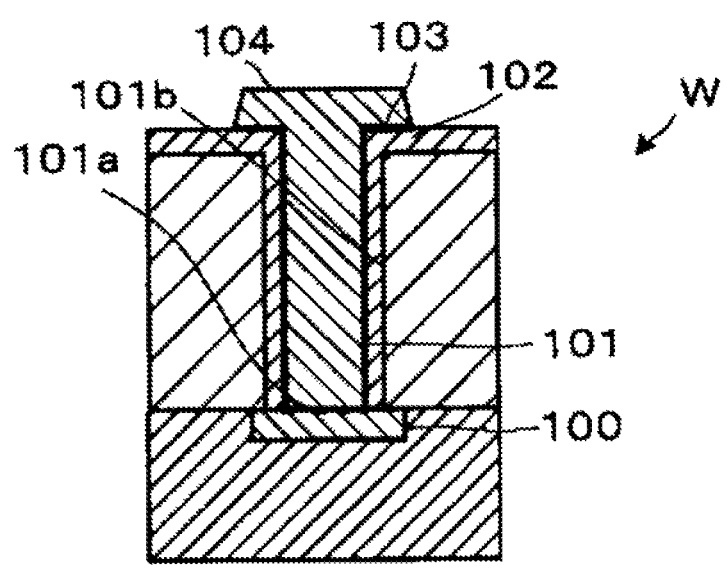

Next, as shown in FIG. 1F, the exposed barrier seed layer 103 is removed, and thus the manufacture of the electrode penetrating the semiconductor wafer W is completed.

Figure 1G:
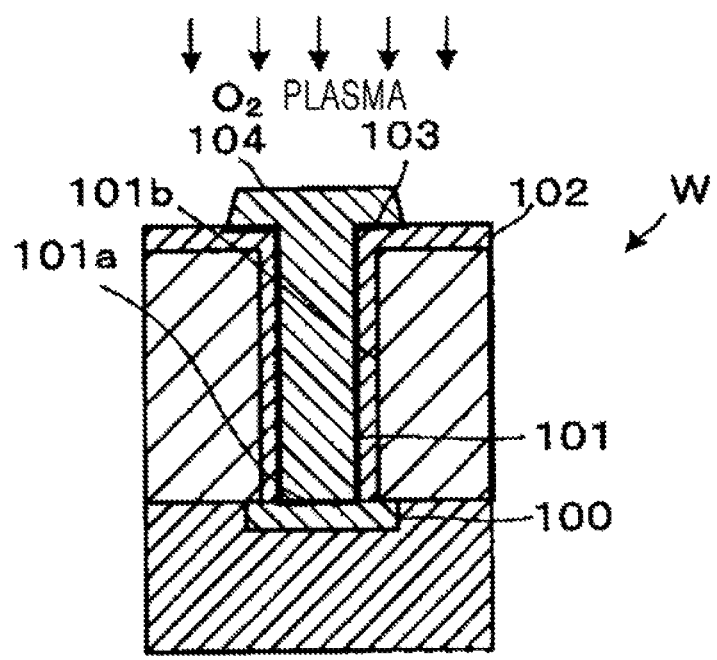

Next, as shown in FIG. 1G, a process for removing at least a part of a surface of the polyimide film 102 is performed by oxygen plasma. The process for removing the surface of the polyimide film 102 may be performed by applying radicals of oxygen by using down flow plasma instead of applying a bias to the semiconductor wafer W. In this case, the surface of the polyimide film 102 may be removed by 0.1 μm or greater.

Figure 1H:
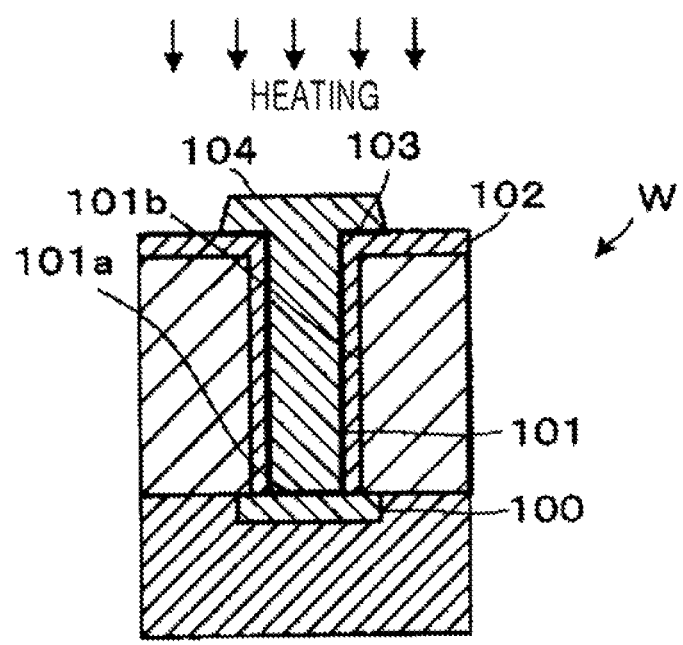

Next, as shown in FIG. 1H, an annealing process is performed on the semiconductor wafer W in a dysoxidative atmosphere, for example, a nitrogen in atmosphere. A heating temperature of the annealing process may be, for example, equal to or greater than 200° C., preferably 200° C. to 400° C., and more preferably, 200° C. to 30£3° C. Also, the annealing process may be performed for, for example, about 30 minutes.

The insulating property of the polyimide film 102 may be restored by performing the process for removing the surface of the polyimide film 102 by oxygen plasma and the annealing process on the semiconductor wafer W.

In the processes, even if an organic film such as the polyimide film is used as an insulating film, cleaning may be performed through a dry process using Ar plasma without performing, for example, wet cleaning, and thus the insulating property of the insulating film may be restored, thereby preventing degradation of the insulating property of the polyimide film.

The graph shown in FIG. 2, in which a vertical axis and a horizontal axis respectively represent a leak current per unit area (A/cm$^2$) and an electric field strength (MV/cm), shows whether a cleaning process through irradiation of Ar plasma is performed, and also shows a measurement result of an insulating property of the polyimide film after restoring the damaged polyimide film. Comparing "before cleaning process" and "after cleaning process" in the graph of FIG. 2, the insulating property of the polyimide film is degraded due to the irradiation of Ar plasma, and thus a leak current is increased to equal to or greater than a 4-digit figure compared to the leak current before the irradiation of Ar plasma.

The measurement of the leak current is performed on the semiconductor wafer by using a sample manufactured by forming a through silicon via (TSV) structure shown in FIG. 3. Hereinafter, a method of manufacturing the sample will be described with reference to FIG. 3.

As shown in part (a) of FIG. 3, a hole 201 is formed in a silicon substrate 200, and a polyimide film 202 (having a thickness of about 1.0 μm) is formed on a surface of the silicon substrate 200, including the hole 201. The formation of the polyimide film 202 is performed by a co-evaporation polymerization reaction by using PMDA and ODA as a monomer raw material.

Next, as shown in part (b) of FIG. 3, Ar plasma is irradiated. The irradiation of Ar plasma is performed for 60 seconds by using high-frequency power of 200 W.

Next, as shown in part (c) of FIG. 3, a barrier seed layer 203 is formed. The barrier seed layer 203 is formed by sputtering a Cu/TiN/Ti film, wherein the Cu, the TN, and the Ti have thicknesses 1000 nm, 35 nm, and 35 nm, respectively.

Next, as shown in part (d) of FIG. 3, a photoresist mask 204 is formed, and an electrode 205 is formed on a bottom portion and a side wall portion of the hole 201 and around an opening of the hole 201 by plating Sn/Cu.

Next, as shown in part (e) of FIG. 3, the photoresist mask 204 is detached by using a detaching solution, and then the exposed barrier seed layer 203 is removed as shown in part (f) of FIG. 3.

Next, as shown in part (g) of FIG. 3, a leak current of the sample manufactured according to the above-described process is measured by bringing a probe 210 into contact with the electrode 205 and grounding a rear surface of the silicon substrate 200. The measurement result is shown as "after the cleaning process" in the graph of FIG. 2.

Also, as shown in part (b) of FIG. 3, after irradiating the Ar plasma, a leak current of a sample in which a surface of the polyimide film is removed by using down flow plasma of oxygen is also measured. The measurement result is shown as "after the O$_2$ plasma process" in the graph of FIG. 2.

In addition, after the surface of the polyimide film is removed by using down flow plasma of oxygen, a leak current of a sample in which an annealing process is performed is also measured. The measurement result is shown as "after the annealing process" in the graph of FIG. 2.

As shown in the graph of FIG. 2, compared to "before the cleaning process", a leak current is increased to equal to or greater than a 4-digit number when the Ar plasma is irradiated (after the cleaning process shown in FIG. 2), and thus an insulating property of the polyimide film is significantly degraded. Also, if the surface of the polyimide film is removed by using down flow plasma of oxygen to restore damage of the polyimide film, an insulating property of the polyimide film is improved to a certain degree, and although the leak current is decreased compared to before restoring the damage of the polyimide film, the leak current is increased compared to "before the cleaning process", and thus the damage of the polyimide film is not completely restored (after the $O_2$ plasma process shown in FIG. 2).

Then, if the annealing process is performed after the surface of the polyimide in film is removed by using down flow plasma of oxygen, the leak current is decreased up to a level that is equal to that before the cleaning process, and thus the damage of the polyimide film is restored, thereby making the insulating property of the polyimide film equal to that before the cleaning process (after the annealing process shown in FIG. 2).

FIG. 14 shows these results. FIG. 14 shows leak currents and characteristics of a polyimide film having an electric field strength of 0.10 MV/cm after various processes are performed on a real sample. Although the leak current of the polyimide film after $O_2$ plasma process is a single digit greater than a leak current before the cleaning process, the leak current returns to its original digit figure by performing a restoring process including annealing. If the leak current is increased by a single digit, the entire power consumption is increased, and thus to permit the increase in the leak current is unfavorable. Also, since the result shown in FIG. 14 is obtained by measuring the real sample shown in FIG. 3, the result shown in FIG. 14 differs from that of the measuring sample shown in FIG. 5 in figures of the leak current, in particular, digit figures. However, tendencies of obtained results thereof are the same, and technological features thereof are the same.

As described above, according to embodiments of the present invention, even if an organic film such as a polyimide film is used as an insulating film, degradation of an insulating property of the insulating film caused by cleaning through irradiation of plasma of an inert gas may be restored, and thus a good quality semiconductor device capable of preventing generation of a leak current may be manufactured.

While this invention has been particularly shown and described with reference to exemplary embodiments thereof, it will be understood by those skilled in the art that various changes in form and details may be made therein without departing from the spirit and scope of the invention as defined by the appended claims.

[LIST OF REFERENCE NUMERALS]

100: wiring portion
101: hole
101a: bottom portion
101b: side wail portion
102: polyimide film
103: barrier seed layer
104: conductive metal
W: semiconductor wafer The invention claimed:

1. A method of manufacturing a semiconductor device, the method comprising:
   forming a hole penetrating from one surface of a substrate to an electrode formed on the other surface of the substrate;
   forming an organic insulating film in the hole;
   removing at least a part of the organic insulating film formed in a bottom portion of the hole and not the organic insulating film formed on a side wall portion of the hole, to expose the electrode;
   cleaning an exposed surface of the electrode by using plasma of an inert gas;
   filling a conductive metal in the hole;
   removing at least a part of a surface of the organic insulating film by the reaction of oxygen plasma after the cleaning is performed; and
   annealing the substrate in a dysoxidative atmosphere after the removing of at least the part of the surface of the organic insulation film is performed.

2. The method of claim 1, wherein the organic insulating film is a polyimide film.

3. The method of claim 2, wherein the polyimide film is formed by evaporation polymerization.

4. The method of claim 2, wherein Ar plasma is used as the plasma of the inert gas during the cleaning.

5. The method of claim 2, wherein the removing of the surface of the organic insulating film is performed by using down flow plasma.

6. The method of claim 2, wherein in the annealing of the substrate, the substrate is heated to 200° C. to 400° C.

7. The method of claim 2, wherein in the removing of the surface of the organic insulating film, the surface of the polyimide film is removed by at least 0.1 μm.

8. The method of claim 2, wherein in the annealing of the substrate, the substrate is heated to 200° C. to 300° C.

* * * * *